(12) United States Patent
Fishburn

(10) Patent No.: US 12,641,802 B2
(45) Date of Patent: May 26, 2026

(54) LINER TO FORM COMPOSITE HIGH-K DIELECTRIC

(71) Applicant: Applied Materials, Inc., Santa Clara, CA (US)

(72) Inventor: Fredrick Fishburn, Aptos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 542 days.

(21) Appl. No.: 18/116,909

(22) Filed: Mar. 3, 2023

(65) Prior Publication Data

US 2023/0307491 A1 Sep. 28, 2023

Related U.S. Application Data

(60) Provisional application No. 63/323,122, filed on Mar. 24, 2022.

(51) Int. Cl.
*H10B 12/00* (2023.01)
*H10D 1/68* (2025.01)

(52) U.S. Cl.
CPC .............. *H10D 1/68* (2025.01); *H10B 12/00* (2023.02); *H10B 12/03* (2023.02)

(58) Field of Classification Search
CPC .......... H10D 1/68; H10D 1/688; H10D 1/694; H10D 1/716; H10B 12/00; H10B 12/03
See application file for complete search history.

(56) References Cited

U.S. PATENT DOCUMENTS

| | | | |
|---|---|---|---|
| 7,595,262 B2 | 9/2009 | Schlösser | |
| 10,607,995 B2 | 3/2020 | Roberts et al. | |
| 10,825,815 B2 | 11/2020 | Tang et al. | |
| 2017/0141300 A1* | 5/2017 | Trinh ................... | H10N 70/826 |
| 2018/0197864 A1* | 7/2018 | Sills ....................... | H10B 12/31 |
| 2021/0305356 A1* | 9/2021 | Cheng ................... | H10D 1/694 |

* cited by examiner

*Primary Examiner* — Eva Y Montalvo
(74) *Attorney, Agent, or Firm* — SERVILLA WHITNEY LLC

(57) ABSTRACT

Provided are methods to reduce the thickness of a high-κ layer needed in a DRAM capacitor and, thus, allow the cell electrodes to be larger, giving higher cell capacitance. A tantalum nitride (TaN) layer is introduced as a liner in the capacitor hole before a titanium nitride (TiN) electrode layer. The TaN layer converts to a thin layer of tantalum oxide ($Ta_2O_5$), which permits a reduction in the high-κ layer thickness for the same capacitance versus leakage. Because this $Ta_2O_5$ is formed directly on the cell electrode, it ensures a low leakage film exists in the narrowest gaps even before the high-κ layer is deposited.

8 Claims, 3 Drawing Sheets

LINER TO FORM COMPOSITE HIGH-K DIELECTRIC

CROSS-REFERENCE TO RELATED APPLICATIONS

This application claims priority to U.S. Provisional Application No. 63/323,122, filed Mar. 24, 2022, the entire disclosure of which is hereby incorporated by reference herein.

TECHNICAL FIELD

Embodiments of the present disclosure pertain to the field of electronic devices and electronic device manufacturing. More particularly, embodiments of the disclosure provide electronic devices including a liner of metal and/or metal nitride to form a composite high-κ dielectric and methods of forming same.

BACKGROUND

Electronic devices, such as personal computers, workstations, computer servers, mainframes, and other computer related equipment such as printers, scanners and hard disk drives use memory devices that provide substantial data storage capability, while incurring low power consumption. There are two major types of random-access memory cells, dynamic and static, which are well-suited for use in electronic devices. Dynamic random-access memories (DRAMs) can be programmed to store a voltage which represents one of two binary values but require periodic reprogramming or "refreshing" to maintain this voltage for more than very short periods of time. Static random-access memories (SRAM) are so named because they do not require periodic refreshing.

DRAM memory circuits are manufactured by replicating billions of identical circuit elements, known as DRAM cells, on a single semiconductor wafer. Each DRAM cell is an addressable location that can store one bit (binary digit) of data. In its most common form, a DRAM cell consists of two circuit components: a field effect transistor (FET) and a capacitor.

The manufacturing of a DRAM cell includes the fabrication of a transistor and a capacitor. DRAM manufacturing is a highly competitive business. There is continuous pressure to decrease the size of individual cells and to increase memory cell density to allow more memory to be squeezed onto a single memory chip, especially for densities greater than 8 Gigabits. Limitations on cell size reduction include the passage of both bitlines and word lines through the cell, the size of the cell capacitor, and the compatibility of array devices with non-array devices.

One problem in decreasing the size of DRAM is how to keep enough cell capacitance with good leakage and low density of cell-to-cell shorts as the dimensions decrease. To be able to fit a high-κ dielectric material and still have margin against shorting near the bow region and with local critical dimension non-uniformity (LCDU) issues, the space between cells is less than about 15 nm. The pitch between cells is about 40 nm and will decrease to less than 32 nm pitch by D1d node. The gap between cell electrodes needs to be large enough that, in the worst case, enough low-leakage dielectric can be deposited to prevent cell to cell shorts.

DRAM typically uses zirconium oxide ($ZrO_2$) and about one atomic layer of aluminum oxide ($Al_2O_3$) deposited on a titanium nitride (TiN) electrode. During deposition of the high-κ layer, titanium oxide (TiO) forms on the titanium nitride (TiN) electrode causing the titanium nitride electrode to be leaky. Aluminum oxide is used somewhere in the stack to reduce leakage, but any more than about two angstroms results in too great of a loss in capacitance. Zirconium oxide ($ZrO_2$) is needed to offset direct tunneling.

Thus, there is a need in the art for improved DRAM and methods of manufacture.

SUMMARY

One or more embodiments of the disclosure are directed to a capacitor of a memory device. In one or more embodiments, the memory device comprises: a bottom electrode comprising a pillar of electrode material; a metal nitride liner on the bottom electrode; an oxide layer on the metal nitride liner; a high-κ dielectric layer on the oxide layer; and a top electrode on the high-κ dielectric layer.

Additional embodiments of the disclosure are directed to a method of forming a memory device. In one or more embodiments, the method comprises: forming a plurality of capacitor holes in a substrate, the substrate comprising an etch stop layer, a core oxide layer, and a support nitride layer; depositing a metal nitride liner in the capacitor holes; depositing a bottom electrode material on the metal nitride liner; patterning the memory device to form a plurality of openings in the support nitride layer; removing the core oxide layer through the plurality of openings; depositing a high-κ dielectric layer in the plurality of openings on the nitride liner, wherein the deposition forms an oxide layer on the nitride liner; and depositing a top electrode material on the high-κ dielectric layer to form a capacitor.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

FIG. 1 illustrates a cross-section view of a DRAM device according to the prior art;

Figure 2:
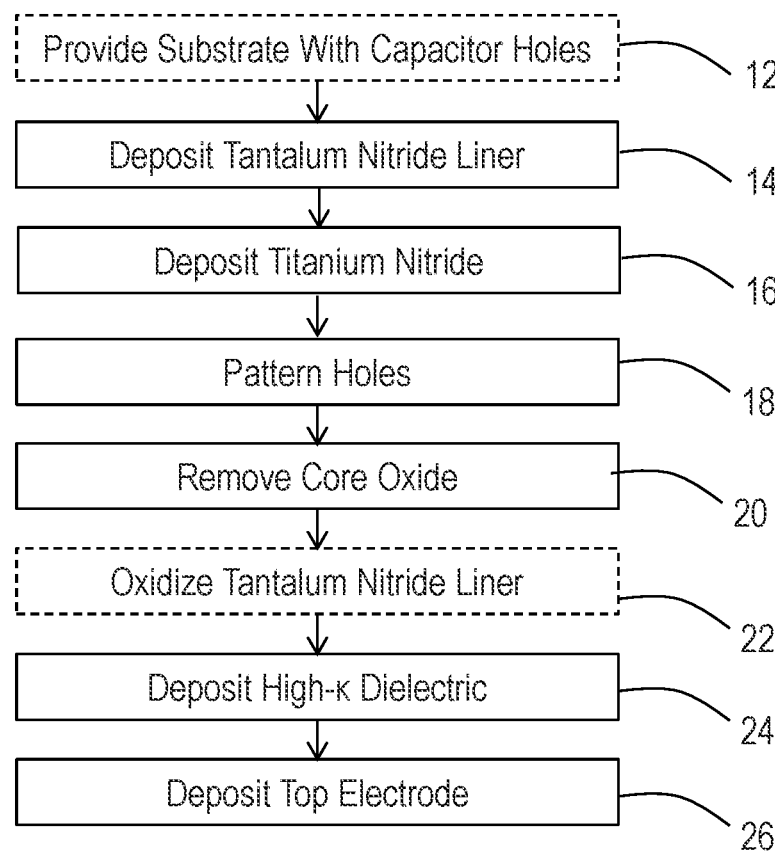
FIG. 2 illustrates a process flow diagram for a method for forming a device according to one or more embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can refer to only a portion of the substrate unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus, for example, where a film/layer or partial film/layer has been deposited onto a substrate surface, the exposed surface of the newly deposited film/layer becomes the substrate surface.

The term "on" indicates that there is direct contact between elements. The term "directly on" indicates that there is direct contact between elements with no intervening elements.

As used in this specification and the appended claims, the terms "precursor," "reactant," "reactive gas" and the like are used interchangeably to refer to any gaseous species that can react with the substrate surface.

"Atomic layer deposition" or "cyclical deposition" as used herein refers to the sequential exposure of two or more reactive compounds to deposit a layer of material on a substrate surface. The substrate, or portion of the substrate, is exposed separately to the two or more reactive compounds which are introduced into a reaction zone of a processing chamber. In a time-domain ALD process, exposure to each reactive compound is separated by a time delay to allow each compound to adhere and/or react on the substrate surface and then be purged from the processing chamber. These reactive compounds are said to be exposed to the substrate sequentially. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas (e.g., nitrogen gas) are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

As used herein, "chemical vapor deposition" refers to a process in which a substrate surface is exposed to precursors and/or co-reagents simultaneous or substantially simultaneously. As used herein, "substantially simultaneously" refers to either co-flow or where there is overlap for a majority of exposures of the precursors.

Plasma enhanced chemical vapor deposition (PECVD) is widely used to deposit thin films due to cost efficiency and film property versatility. In a PECVD process, for example, a hydrocarbon source, such as a gas-phase hydrocarbon or a vapor of a liquid-phase hydrocarbon that have been entrained in a carrier gas, is introduced into a PECVD chamber. A plasma-initiated gas, typically helium, is also introduced into the chamber. Plasma is then initiated in the chamber to create excited CH-radicals. The excited CH-radicals are chemically bound to the surface of a substrate positioned in the chamber, forming the desired film thereon. Embodiments described herein in reference to a PECVD process can be carried out using any suitable thin film deposition system. Any apparatus description described herein is illustrative and should not be construed or interpreted as limiting the scope of the embodiments described herein.

As used herein, the term "dynamic random-access memory" or "DRAM" refers to a memory cell that stores a datum bit by storing a packet of charge (i.e., a binary one), or no charge (i.e., a binary zero) on a capacitor. The charge is gated onto the capacitor via an access transistor and sensed by turning on the same transistor and looking at the voltage perturbation created by dumping the charge packet on the interconnect line on the transistor output. Thus, a single DRAM cell is made of one transistor and one capacitor.

As used herein, the term "capacitor" refers to an electrical component of a memory cell. A capacitor has two electrical conductors separated by electrically insulating material.

One problem in decreasing the size of DRAM is how to keep enough cell capacitance with good leakage and low density of cell-to-cell shorts as the dimensions decrease. To be able to fit a high-κ dielectric material and still have margin against shorting near the bow region and with local critical dimension non-uniformity (LCDU) issues, the space between cells is less than about 15 nm. The pitch between cells is about 40 nm and will decrease to less than 32 nm pitch by D1d node. The gap between cell electrodes needs to be large enough that, in the worst case, enough low-leakage dielectric can be deposited to prevent cell to cell shorts.

DRAM typically uses zirconium oxide ($ZrO_2$) and about one atomic layer of aluminum oxide ($Al_2O_3$) deposited on a titanium nitride (TiN) electrode. During deposition of the high-κ layer, titanium oxide (TiO) forms on the titanium nitride (TiN) electrode causing the titanium nitride electrode to be leaky. Aluminum oxide is used somewhere in the stack to reduce leakage, but any more than about two angstroms results in too great of a loss in capacitance. Zirconium oxide ($ZrO_2$) is needed to offset direct tunneling.

In one or more embodiments, provided are methods to advantageously reduce the thickness of high-κ layer needed in a DRAM capacitor and, thus, allow the cell electrodes to be larger, giving higher cell capacitance. In one or more embodiments, a tantalum nitride (TaN) layer is advantageously introduced as a liner in the capacitor hole before a titanium nitride (TiN) layer. The TaN layer converts to a thin layer of tantalum oxide ($Ta_2O_5$), which permits a reduction in the high-κ layer thickness for the same capacitance versus leakage. Because this $Ta_2O_5$ is formed directly on the cell electrode, it ensures a low leakage film exists in the narrowest gaps even before the high-κ layer is deposited.

In one or more embodiments, an atomic layer deposition (ALD) tantalum nitride (TaN) layer is advantageously deposited immediately before the ALD deposition of the TiN during the DRAM capacitor formation process flow. This is the TiN which is deposited into the high aspect ratio contact (HARC) capacitor hole. Later in the process flow, the oxide that the capacitors are etched into is removed by a solution such as strong hydrofluoric (HF) acid. The TaN layer can withstand this acid the same way that the TiN does. In one or more embodiments, the high-κ layer deposition process can be optimized by depositing a thinner zirconium oxide ($ZrO_2$) film, since the high-κ layer deposition forms $Ta_2O_5$ on the TaN instead of forming a similar thickness of the leakier titanium oxide (TiO) on the TiN. The method of one or more embodiments results in a DRAM device having similar capacitance but with a significant reduction in cell-to-cell shorts.

In one or more embodiments, the process flow can be further enhanced by increasing the high aspect ratio contact capacitor etched hole critical dimension (CD) size. Increasing the hole size alone is advantageous for reducing the aspect ratio of the etch, but it draws a larger need for hardmask selectivity, since the space between holes is now smaller. This finally will result in larger cell capacitance and equivalent or better cell to cell short density.

The embodiments of the disclosure are described by way of the Figures, which illustrate devices (e.g., DRAM) and processes for forming DRAMs in accordance with one or more embodiments of the disclosure. The processes shown are merely illustrative possible uses for the disclosed processes, and the skilled artisan will recognize that the disclosed processes are not limited to the illustrated applications.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but may be to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the Surface through which the implantation takes place. Thus, the regions illustrated in the figures are schematic in nature and their shapes may be not intended to illustrate the actual shape of a region of a device and are not intended to limit the scope of example embodiments.

Figure 1:
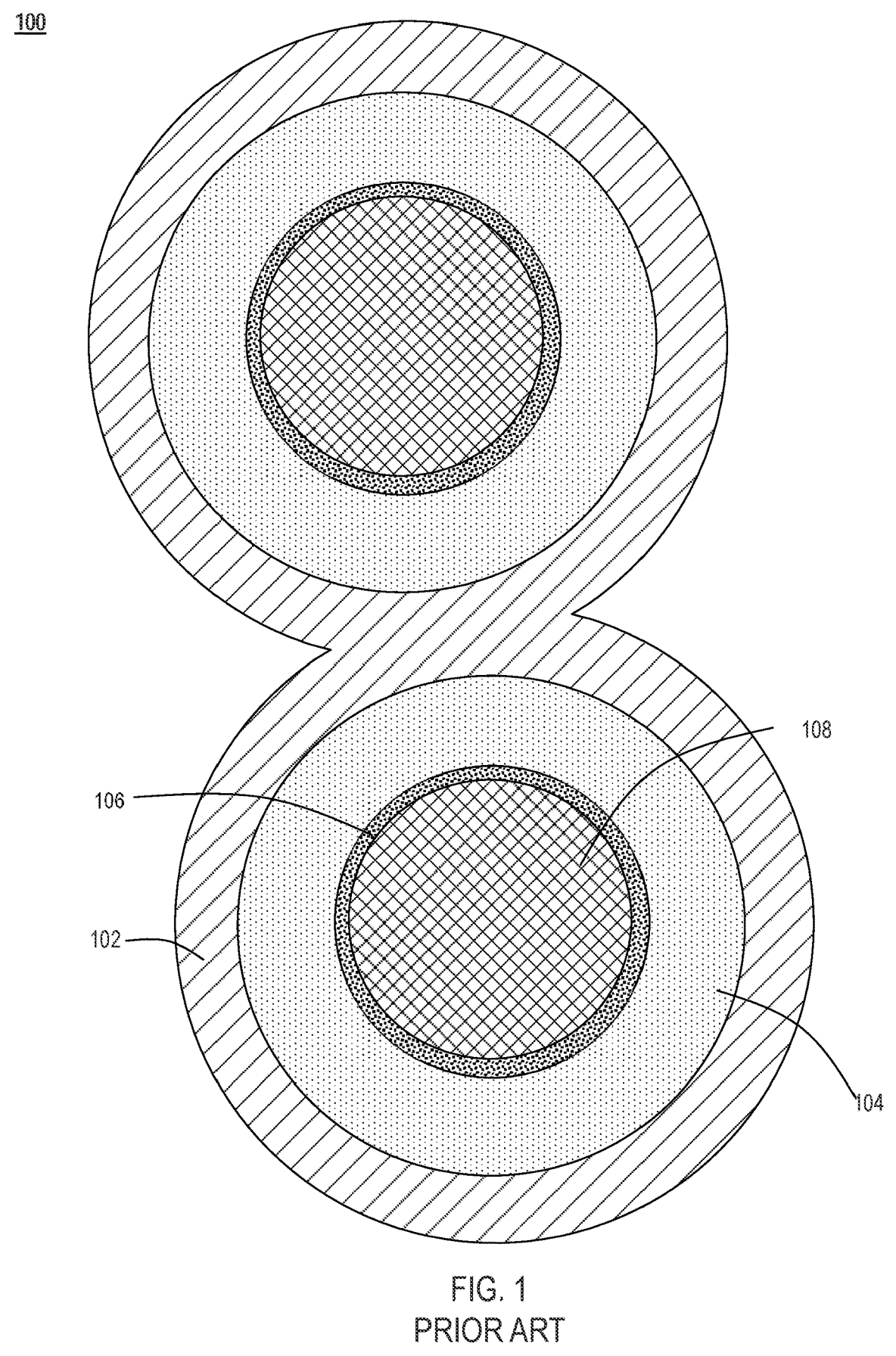
Figure 3:
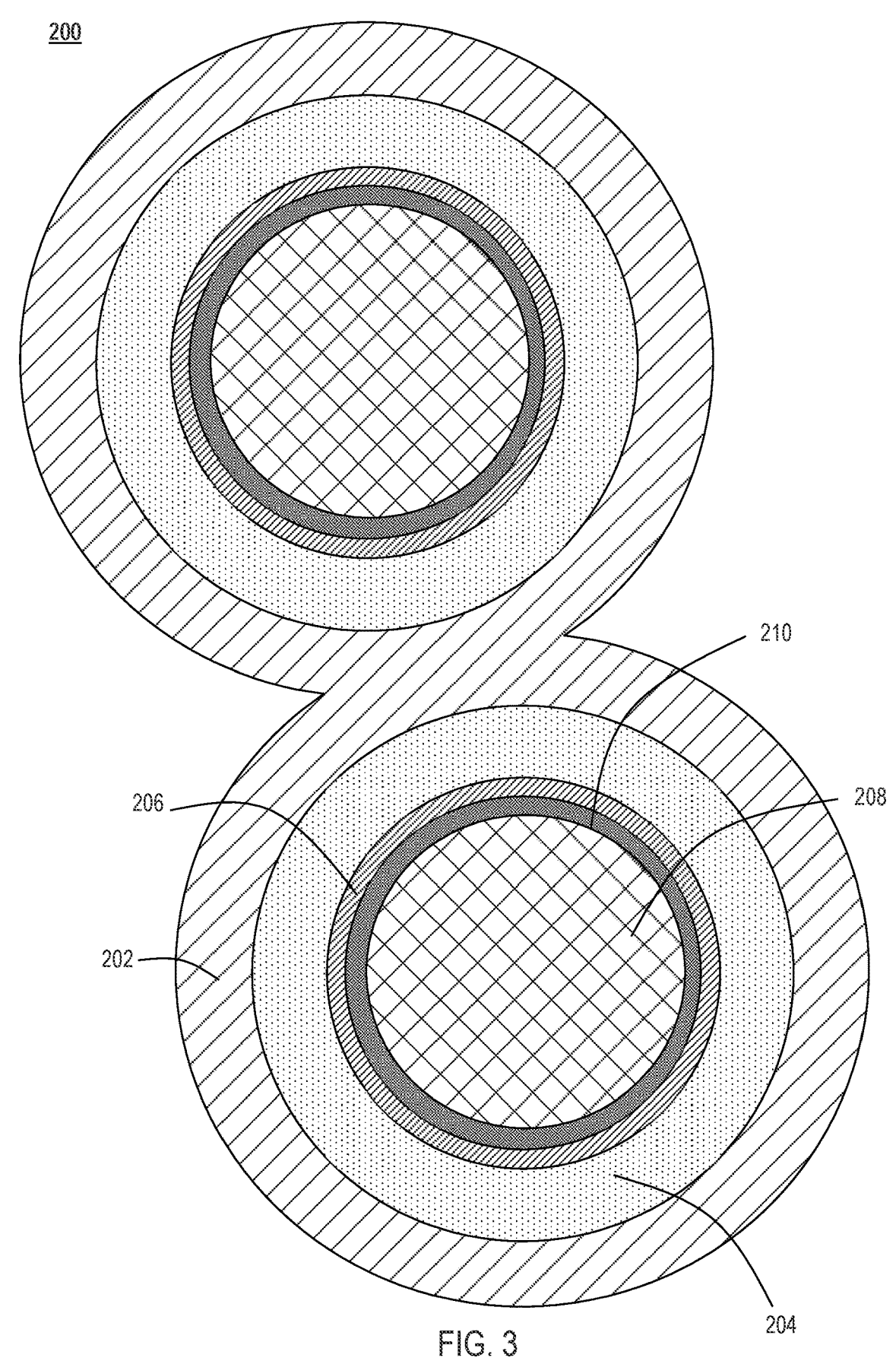
FIG. 3 illustrates a cross-section view of a DRAM device according to one or more embodiments.

FIG. 1 illustrates a cross-sectional view of a capacitor according to the prior art. FIG. 2 illustrates a process flow diagram for a method 10 for forming a semiconductor device in accordance with some embodiments of the present disclosure. FIG. 3 illustrates a cross-sectional view of a capacitor according to one or more embodiments. The method 10 is described below with respect to FIG. 3. The method 10 may be part of a multi-step fabrication process of a semiconductor device, a DRAM in particular.

In one or more embodiments, the method 10 may be performed in any suitable process chamber coupled to a cluster tool. The cluster tool may include process chambers for fabricating a semiconductor device, such as chambers configured for etching, deposition, physical vapor deposition (PVD), chemical vapor deposition (CVD), oxidation, or any other suitable chamber used for the fabrication of a semiconductor device.

FIG. 1 illustrates a cross-section view of a DRAM capacitor 100 according to the prior art. The capacitor hole in a memory cell is filled with a pillar 108 of electrode material. The pillar 108 comprises titanium nitride (TiN). A high-κ layer 104 is formed adjacent to the pillar 108. The high-κ layer 104 includes zirconium oxide ($ZrO_2$) and aluminum oxide ($Al_2O_3$). During deposition of the high-κ layer 104, a layer of titanium oxide (TiO) 106 is formed on the outer edge of the titanium nitride (TiN) pillar 108. The layer of titanium oxide 106 may be formed from oxidation of the titanium nitride (TiN) pillar 108. A top electrode layer 102 is formed adjacent to the high-κ layer 104.

The space between memory cells is about 15 nm to 20 nm to be able to fit the high-κ layer 104 and still have margin against shorting near the bow region. The pitch between memory cells is about 40 nm. The diameter of the pillar 108 of electrode material is less than 16 nm for about 16 nm of space between memory cells.

FIG. 2 depicts a process flow diagram of a method 10 of manufacturing an electronic device in accordance with one or more embodiments of the present disclosure. FIG. 3 illustrates a cross-section view of a DRAM capacitor 200 according to one or more embodiments. With reference to FIG. 2, the method 10 begins at operation 12 by providing a DRAM substrate having high aspect ratio contact capacitor holes formed therein. As used herein, the term "provided" means that the substrate is made available for processing (e.g., positioned in a processing chamber). To prepare the substrate for processing one skilled in the art understands that an etch stop layer is deposited, followed by deposition of core oxide and support nitride. Then the substrate is patterned and etched to form high aspect ratio contact capacitor holes through the nitride, oxide, and etch stop layer. The etch stop layer is removed and the bottom of the capacitor holes are cleaned to expose the cell contact at the bottom of the hole.

The capacitor holes may have any suitable shape, including, but not limited to, circular, oval, tapered, and the like. The capacitor holes can have any suitable aspect ratio (ratio of the depth of the feature to the width of the feature). In some embodiments, the aspect ratio is greater than or equal to about 30:1 or greater than or equal to about 100:1.

Referring to FIG. 2 and FIG. 3, at operation 14, a metal nitride liner 210 is deposited into the capacitor hole. The metal nitride liner 210 may comprise any suitable material known to the skilled artisan. In one or more embodiments, the metal nitride liner 210 comprises one or more of tantalum nitride (TaN), yttrium nitride (YN), zirconium nitride (ZrN), hafnium nitride (HfN), lanthanum nitride (LaN), and barium nitride (BaN). In one or more specific embodiments, the metal nitride liner 210 comprises tantalum nitride.

The metal nitride liner 210 may have any suitable thickness. In one or more embodiments, the metal nitride liner 210 has a thickness in a range of about 1 nm to about 2 nm. In one or more embodiments, a metal nitride liner 210 is formed comprising tantalum nitride (TaN having a thickness in a range of about 1 nm to about 5 nm.

At operation 16, a bottom electrode layer 208 is deposited on the metal nitride liner 210. The bottom electrode layer 208 may comprise any suitable material known to the skilled artisan. In one or more embodiments, the bottom electrode layer 208 comprises titanium nitride (TiN).

The method 10 then proceeds according to standard process flow. At operation 18, the device is patterned and etched to form holes through the support nitride at the intersection between each set of three capacitor holes. The number of these holes is typically much fewer compared to the capacitor holes. At operation 20, the device is etched to remove core oxide by way of the holes in the support nitride.

Referring to FIG. 2 and FIG. 3, at operation 24, a high-κ dielectric layer 204 is deposited through the holes in the support nitride to cover the exposed surface of the capacitor "pillars" (i.e., outside surface of the pillars). In one or more embodiments, the high-κ dielectric layer 204 may comprise any suitable material known to the skilled artisan. In one or more embodiments, the term "high-κ dielectric" refers to a material with a high dielectric constant (as compared to, e.g., silicon dioxide). In one or more embodiments, the high-κ dielectric material is selected from one or more of hafnium oxide ($HfO_2$), zirconium oxide ($ZrO_2$), vanadium oxide ($VO_2$), titanium oxide ($TiO_2$), tin oxide ($SnO_2$), aluminum oxide ($Al_2O_3$), hafnium silicon oxide (HfSiO), zirconium silicon oxide (ZrSiO), niobium oxide ($Nb_2O_5$), or lanthanum oxide (LaO). In some embodiments, the high-κ dielectric layer 204 comprises zirconium oxide ($ZrO_2$) and aluminum oxide ($Al_2O_3$).

The high-κ dielectric layer 204 may have any suitable thickness. In one or more embodiments, the high-κ dielectric layer 204 has a thickness in a range of from about 3 nm to about 6.5 nm. In specific embodiments, the high-κ dielectric layer 204 comprises zirconium oxide ($ZrO_2$) having a total thickness in a range of from about 3 nm to about 6 nm and aluminum oxide ($Al_2O_3$) having a total thickness in a range of from about greater than 0 nm to about 0.5 nm.

During the deposition of the high-κ dielectric layer 204, the metal nitride liner 210 may oxidize to form an oxide layer 208. In such embodiments, the oxide layer 208 is a parasitic oxide layer. In other embodiments, the deposition of the high-κ dielectric layer 204 does not cause the metal nitride liner 210 to oxidize. Thus, at operation 22, the metal nitride liner 210 may be intentionally oxidized. At operation 26, a top electrode layer is deposited on the high-κ dielectric layer forming the common plate for all the capacitors.

In one or more embodiments, the oxide layer 208 comprises one or more of tantalum oxide ($Ta_2O_5$), yttrium oxide (YO), zirconium oxide ($ZrO_2$), hafnium oxide ($HfO_2$), lanthanum oxide ($La_2O_3$), and barium oxide (BaO). In one or more specific embodiments, the oxide layer 208 comprises tantalum oxide ($Ta_2O_5$). In one or more embodiments, during the deposition of the high-κ dielectric layer 204, titanium oxide (TiO) does not form. Thus, the oxide layer 208 does not comprise titanium oxide (TiO).

In one or more embodiments, the oxide layer 206 has any suitable thickness. In some embodiments, the oxide layer 206 has a thickness in a range of from greater than 0 nm to about 1 nm. In one or more specific embodiments, the oxide layer 206 comprises tantalum oxide ($Ta_2O_5$) having a thickness in a range of from greater than 0 nm to about 1 nm.

Because of the presence of the oxide layer 206, the high-κ dielectric layer 204 can be advantageously thinner than a capacitor that does not have an oxide layer 206. Without intending to be bound by theory, it is thought that if the thickness of the high-κ dielectric layer 204 can be scaled thinner, then the diameter of the cell electrode can be larger, giving more cell capacitance. Because this oxide layer 206 is formed directly on the cell electrode, it ensures a low leakage film exists in the narrowest gaps even before the high-κ dielectric layer 204 is deposited.

FIG. 3 illustrates a cross-section view of a DRAM capacitor 200 according to one or more embodiments. The capacitor hole in a memory cell is filled with a pillar 208 of electrode material. In one or more specific embodiments, the pillar 208 comprises titanium nitride (TiN). A metal nitride liner 210 is formed in the capacitor hole prior to formation of the pillar 208. The method then proceeds according to standard process flow. The device is patterned and etched to form holes through the support nitride at the intersection between each set of 3 capacitor holes. The number of these holes is much less as many compared to the capacitor holes. The device is then etched to remove core oxide by way of the holes in the support nitride.

A high-κ dielectric layer 204 is formed adjacent to the metal nitride liner 210 and the pillar 208. In one or more specific embodiments, the high-κ dielectric layer 204 includes zirconium oxide ($ZrO_2$) and aluminum oxide ($Al_2O_3$). During deposition of the high-κ dielectric layer 204, an oxide layer 206 is formed on the outer edges of the capacitor pillar, between the metal nitride liner 210 and the high-κ dielectric layer 204. The oxide layer 206 may be formed by parasitic oxidation of the metal nitride liner 210, or the oxide layer 206 may be formed by intentionally oxidizing the metal nitride liner 210. In one or more specific embodiments, the metal nitride liner 210 comprises tantalum nitride (TaN), and the oxide layer comprises tantalum oxide ($Ta_2O_5$). A top electrode layer 202 is then formed adjacent to the high-κ dielectric layer 204.

In one or more embodiments, a plasma processing apparatus is used to generate the plasma and treat the metal film with ammonia plasma. In one or more embodiments, the plasma processing apparatus is a stand-alone tool and is not part of a cluster tool. In other embodiments, the plasma processing apparatus is part of a cluster tool.

Several well-known cluster tools which may be adapted for the present disclosure are the Olympia®, the Continuum®, and the Trillium®, all available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), plasma treatment, etch, pre-clean, chemical clean, thermal treatment such as RTP, plasma nitridation, degas, hydroxylation and other substrate processes. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants (e.g., reactant). According to one or more embodiments, a purge gas is injected at the exit of the deposition chamber to prevent reactants (e.g., reactant) from moving from the deposition chamber to the transfer chamber and/or additional processing chamber. Thus, the flow of inert gas forms a curtain at the exit of the chamber.

The substrate can be processed in single substrate deposition chambers, where a single substrate is loaded, processed, and unloaded before another substrate is processed. The substrate can also be processed in a continuous manner, similar to a conveyer system, in which multiple substrates are individually loaded into a first part of the chamber, move through the chamber, and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support, and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

One or more embodiments provide a non-transitory computer readable medium including instructions, that, when executed by a controller of a processing chamber, causes the processing chamber to perform the operations of: provide a substrate having plurality of trenches thereon; deposit a conformal gate oxide layer on the substrate; deposit a temporary fill layer on a top surface of the gate oxide layer to seal the plurality of trenches; recess the temporary fill layer to form a recess in each of the plurality of trenches;

deposit a support layer material in the recess and on the top surface of the gate oxide; remove the temporary fill material to expose the gate oxide layer on a sidewall and a bottom surface of each of the plurality of trenches; deposit a gapfill material in the plurality of trenches; and remove the support layer material.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods, and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A capacitor of a memory device comprising:

a bottom electrode comprising a pillar of electrode material;

a metal nitride liner directly on the bottom electrode, the metal nitride liner comprising one or more of tantalum nitride (TaN), yttrium nitride (YN), zirconium nitride (ZrN), hafnium nitride (HfN), lanthanum nitride (LaN), and barium nitride (BaN);

an oxide layer directly on the metal nitride liner, oxide layer comprising one or more of tantalum oxide ($Ta_2O_5$), yttrium oxide (YO), zirconium oxide ($ZrO_2$), hafnium oxide ($HfO_2$), lanthanum oxide ($La_2O_3$), and barium oxide (BaO);

a high-κ dielectric layer directly on the oxide layer, the high-κ dielectric layer having a thickness in a range of from about 3 nm to about 6.5 nm; and a top electrode on the high-κ dielectric layer.

2. The capacitor of claim 1, wherein the metal nitride liner consists essentially of tantalum nitride (TaN).

3. The capacitor of claim 1, wherein the metal nitride liner has a thickness in a range of from about 1 nm to about 4 nm.

4. The capacitor of claim 1, wherein the oxide layer consists essentially of tantalum oxide ($Ta_2O_5$).

5. The capacitor of claim 1, wherein the oxide layer has a thickness in a range of from greater than 0 nm to about 1 nm.

6. The capacitor of claim 1, wherein the high-κ dielectric layer comprises one or more of hafnium oxide ($HfO_2$), zirconium oxide ($ZrO_2$), vanadium oxide ($VO_2$), titanium oxide ($TiO_2$), aluminum oxide ($Al_2O_3$), hafnium silicon oxide (HfSiO), zirconium silicon oxide (ZrSiO), niobium oxide ($Nb_2O_5$), or lanthanum oxide (LaO).

7. The capacitor of claim 6, wherein the high-κ dielectric layer consists essentially of zirconium oxide (ZrO) and aluminum oxide ($Al_2O_3$).

8. The capacitor of claim 1, wherein the bottom electrode and the top electrode independently comprise titanium nitride (TiN).

* * * * *